United States Patent
Lee et al.

(10) Patent No.: US 7,459,358 B2
(45) Date of Patent: Dec. 2, 2008

(54) METHOD FOR FABRICATING A SEMICONDUCTOR DEVICE

(75) Inventors: Sang Don Lee, Gyeonggi-do (KR); Sung Woong Chung, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/414,353

(22) Filed: May 1, 2006

(65) Prior Publication Data
US 2007/0170522 A1    Jul. 26, 2007

(30) Foreign Application Priority Data
Jan. 23, 2006    (KR) ................ 10-2006-0006966

(51) Int. Cl.
*H01L 21/336* (2006.01)
(52) U.S. Cl. ................ 438/197; 438/209; 438/270; 257/E21.429
(58) Field of Classification Search ............ 438/197, 438/209, 270; 257/330, E21.429
See application file for complete search history.

(56) References Cited

U.S. PATENT DOCUMENTS

| | | | |
|---|---|---|---|
| 6,798,017 B2* | 9/2004 | Furukawa et al. | 257/329 |
| 6,798,018 B2* | 9/2004 | Takaishi et al. | 257/334 |
| 2005/0173759 A1* | 8/2005 | Kim et al. | 257/331 |
| 2006/0273381 A1* | 12/2006 | Kim et al. | 257/330 |
| 2007/0173007 A1* | 7/2007 | Lee et al. | 438/209 |

FOREIGN PATENT DOCUMENTS

| KR | 10-2005-0038843 A | 4/2005 |
|---|---|---|
| KR | 10-2005-0080612 A | 8/2005 |

OTHER PUBLICATIONS

J.Y. Kim et al., "S-RCAT (Sphere-shaped-Recess-Channel-Array Transistor) Technology for 70nm DRAM feature size and beyond", 2005 Symposium on VLSI Technology Digest of Technical Papers, pp. 34-35.

* cited by examiner

*Primary Examiner*—Tuan N. Quach
(74) *Attorney, Agent, or Firm*—Townsend and Townsend and Crew LLP (57) ABSTRACT

The semiconductor device includes an active region, a recess, a Fin-type channel region, a gate insulating film, and a gate electrode. The active region is defined by a device isolation structure formed in a semiconductor substrate. The recess is formed by etching the active region and its neighboring device isolation structure using an island-type recess gate mask as an etching mask. The Fin-type channel region is formed on the semiconductor substrate at a lower part of the recess. The gate insulating film is formed over the active region including the Fin-type channel region and the recess. The gate electrode is formed over the gate insulating film to fill up the Fin-type channel region and the recess.

15 Claims, 9 Drawing Sheets

METHOD FOR FABRICATING A SEMICONDUCTOR DEVICE

BACKGROUND OF THE INVENTION

When a channel length of a cell transistor is decreased, an ion concentration of a cell channel region is generally increased in order to maintain a threshold voltage of the cell transistor. An electric field in source/drain regions of the cell transistor is enhanced to increase leakage current, which results in degradation of a refresh characteristic of a DRAM structure. Therefore, there is a need for semiconductor devices in which the refresh characteristic is improved.

Figure 1:
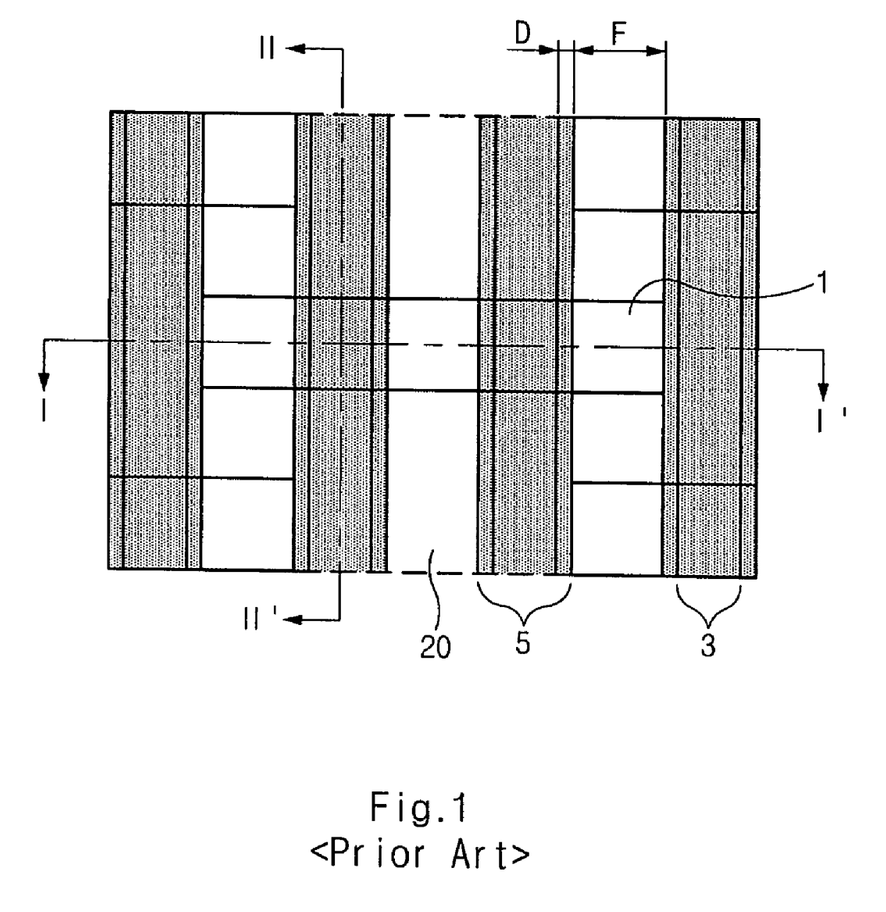
FIG. 1 is a simplified layout of a conventional semiconductor device.

FIG. 1 is a simplified layout of a conventional semiconductor device, wherein reference numerals 1, 3, and 5 denote an active region, a recess gate region, and a gate region, respectively.

Referring to FIG. 1, a width of the recess gate region 3 is less than that of the gate region 5 by a distance 2D. A distance F is the distance between the neighboring gate regions 5.

Figure 2A:
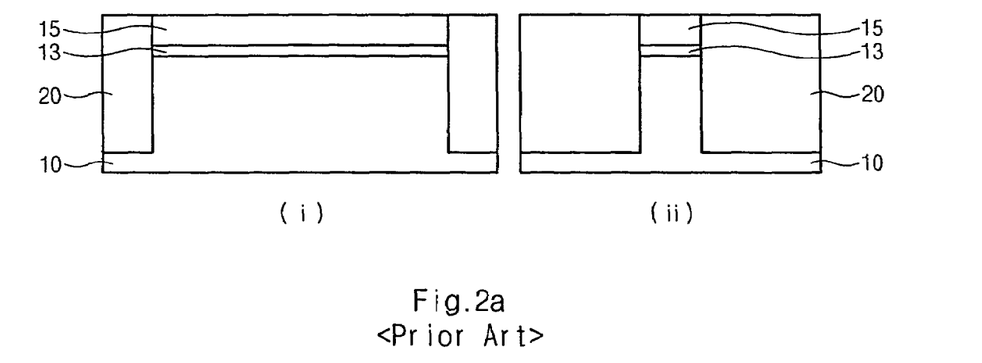
FIGS. 2a through 2g are simplified cross-sectional views illustrating a conventional method for fabricating a semiconductor device.

FIGS. 2a through 2g are simplified cross-sectional views illustrating a conventional method for fabricating a semiconductor device, wherein FIGS. 2a(i) through 2g(i) are cross-sectional views taken along the line I-I' of FIG. 1, and FIGS. 2a(ii) through 2g(ii) are cross-sectional views taken along the line II-II' of FIG. 1.

Referring to FIG. 2a, a device isolation structure 20 is formed on a semiconductor substrate 10 having a pad oxide film 13 and a pad nitride film 15.

Figure 2B:
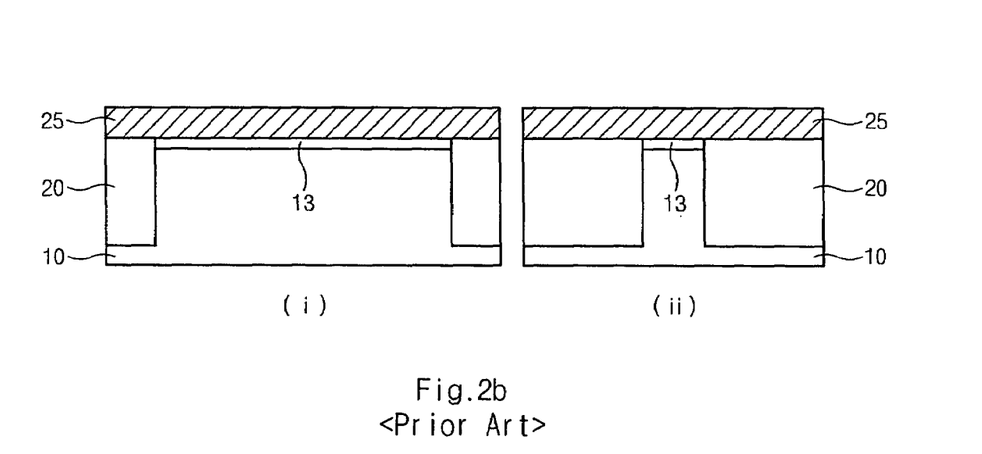

Referring to FIG. 2b, the pad nitride film 15 is removed. Ion implantation is performed on the entire surface to form a well and ion implantation region (not shown) in the semiconductor substrate 10. A planarized polysilicon layer 25 is formed on the entire surface of the resultant.

Figure 2C:
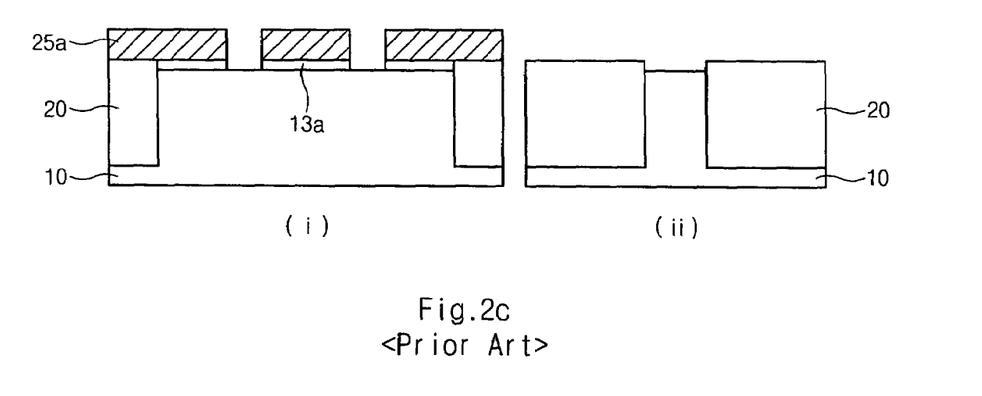

Referring to FIG. 2c, the polysilicon layer 25 and the pad oxide film 13 are etched using a recess gate mask (not shown) as an etching mask to form a polysilicon layer pattern 25a and a pad oxide film pattern 13a to define the recess gate region 3 shown in FIG. 1.

Figure 2D:
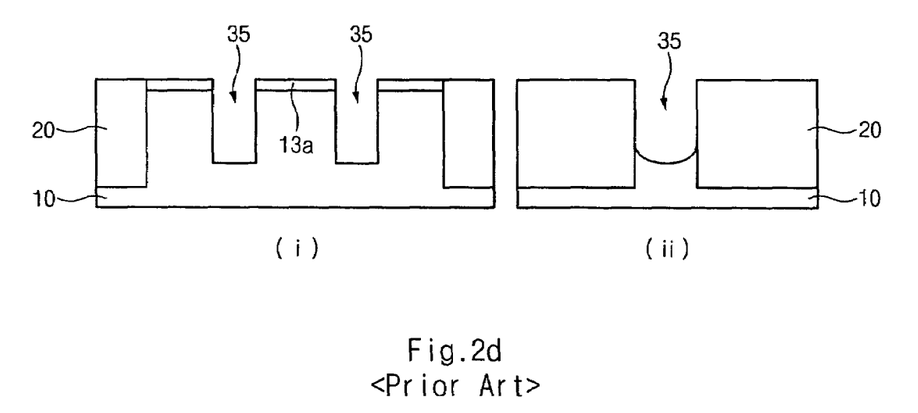

Referring to FIG. 2d, a predetermined thickness of the semiconductor substrate 10 in the recess gate region 3 shown in FIG. 1 is etched to form a first recess 35. The polysilicon layer pattern 25a is removed during a process for forming the first recess 35. In addition, a silicon horn is formed at the semiconductor substrate 10 near to the device isolation structure 20 because the etching rate of the semiconductor substrate 10 near to the device isolation structure 20 is relatively slower than that of the semiconductor substrate 10 far from the device isolation structure 20.

Figure 2E:
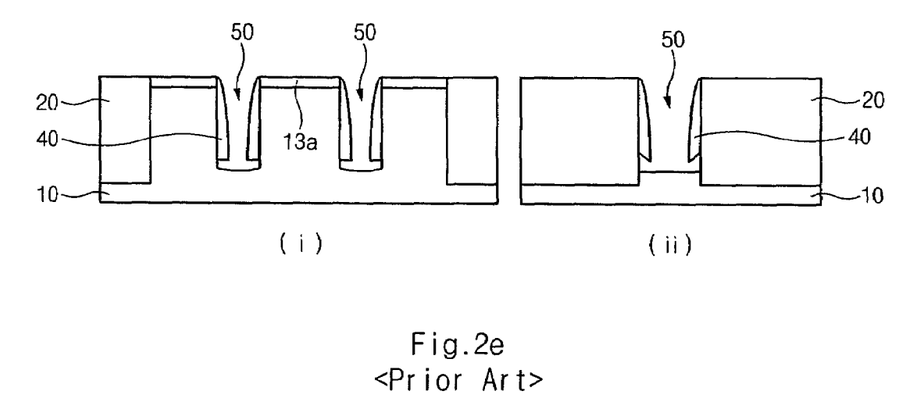

Referring to FIG. 2e, CVD oxide spacers 40 are formed on sidewalls of the first recess 35 and the pad oxide film pattern 13a. The semiconductor substrate 10 exposed at the bottom of the first recess 35 is etched by a predetermined thickness to form a second recess 50.

Figure 2F:
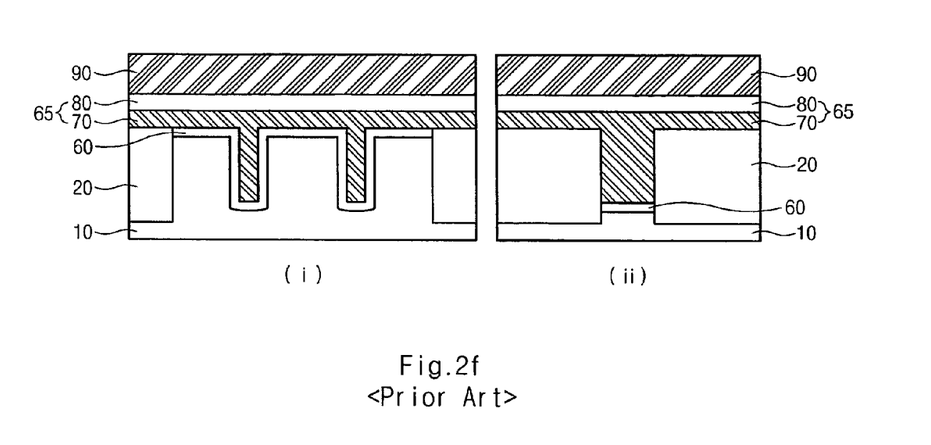

Referring to FIG. 2f, the spacers 40 and the pad oxide film pattern 13a are removed to expose the semiconductor substrate 10. A gate insulating film 60 is formed on the exposed semiconductor substrate 10. A planarized gate conductive layer 65 filling up the second recess 50 is formed over the gate insulating film 60. A gate hard mask layer 90 is formed over the gate conductive layer 65. Here, the gate conductive layer 65 is a stacked structure of a lower gate conductive layer 70 and an upper gate conductive layer 80.

Figure 2G:
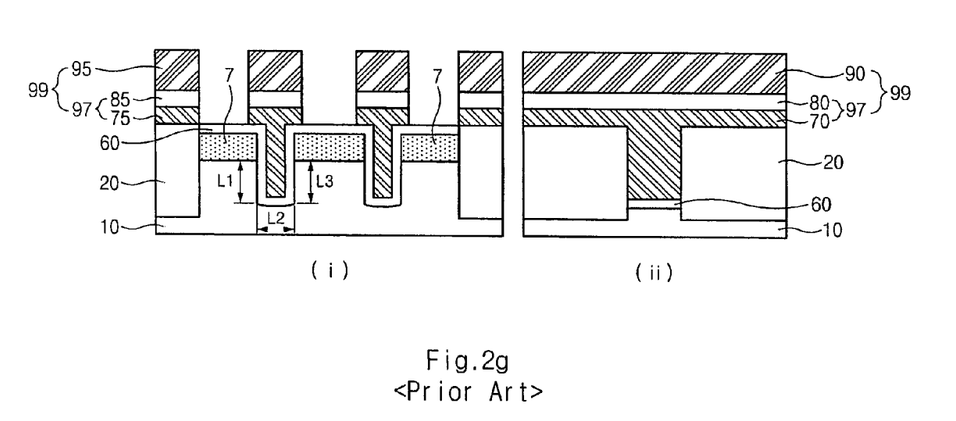

Referring to 2g, the hard mask layer 90 and the gate conductive layer 65 are etched using a gate mask (not shown) as an etching mask to form a gate 99. Here, a gate channel region (L1+L2+L3), which is disposed under a storage node junction region 7 to be formed in a subsequent process, includes a vertical channel region L1, L3 and a horizontal channel region L2.

The subsequent process for forming storage node junction region 7 may be done by known semiconductor fabrication processes.

According to the above conventional method for fabricating a semiconductor device, the total length (L1+L2+L3) of the gate channel region is enlarged according to increase in a depth of the vertical channel region L1, L3 or a width of the horizontal channel region L2. In particular, in order to increase the width of the horizontal channel region L2, the etching process for the second recess may be performed using an isotropic etching method.

However, increasing the width of the horizontal channel region L2 increases a channel resistance. As a result, the total resistance of a transistor is increased. Accordingly, read/write speed characteristics of the DRAM device are less favorable a driving current of the device is decreased.

BRIEF SUMMARY OF THE INVENTION

The present invention relates to a semiconductor device and a method for fabricating the same wherein a recess channel region and a Fin channel region at a lower part of the recess channel region are formed by using an island shaped recess gate mask which exposes a predetermined region of a semiconductor substrate and its neighboring device isolation structure, thereby increasing write/read speed characteristics of the device and improving a refresh characteristic of the device.

According to an embodiment of the present invention, a semiconductor device includes: a device isolation structure formed in a semiconductor substrate to define an active region; a recess formed by etching the active region and its neighboring device isolation structure using an island shaped recess gate mask as an etching mask; a Fin channel region formed on the semiconductor substrate at a lower part of the recess; a gate insulating film formed over the active region including the Fin channel region and the recess; and a gate electrode formed over the gate insulating film to fill up the Fin channel region and the recess.

According to another embodiment of the present invention, a method for fabricating a semiconductor device includes: (a) forming a device isolation structure in a semiconductor substrate to define an active region having a pad insulating film; (b) etching the pad insulating film to expose the semiconductor substrate; (c) etching a predetermined thickness of the exposed semiconductor substrate using an island shaped recess gate mask to form a recess, wherein a Fin channel region is formed at a lower part of the recess; (d) forming a gate insulating film over the active region including the Fin channel region and the recess; (e) forming a gate conductive layer filling up the Fin channel region and the recess; (f) forming a gate hard mask layer over the gate conductive layer; and (g) patterning the gate hard mask layer and the gate conductive layer using a gate mask as an etching mask to form a gate.

DETAILED DESCRIPTION OF THE INVENTION

Reference will now be made in detail to exemplary embodiments of the present invention. Wherever possible, the same reference numbers will be used throughout the drawings to refer to the same or like parts. It should be appreciated that the embodiments are provided to describe and enable the invention to those skilled in the art. Accordingly, the embodiments described herein may be modified without departing from the scope of the present invention.

Figure 3:
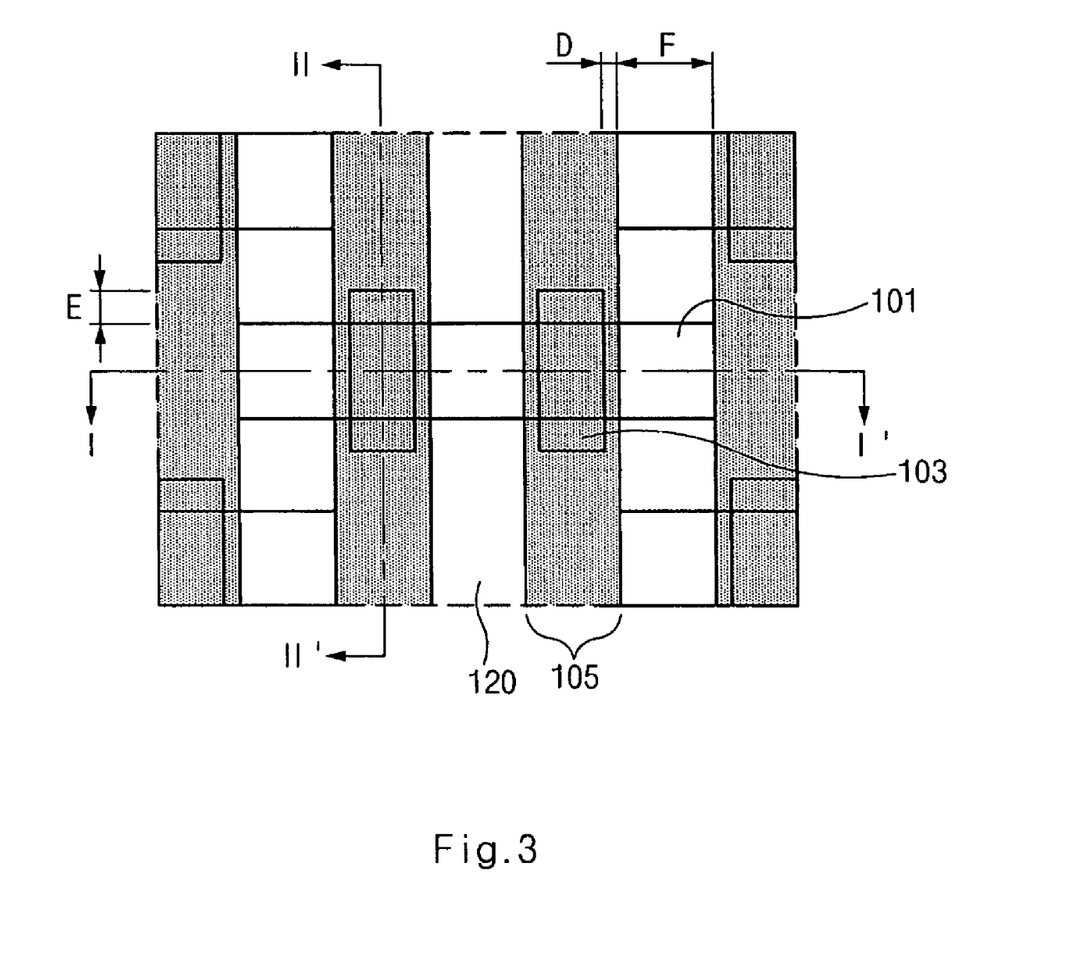
FIG. 3 is a simplified layout of a semiconductor device according to an embodiment of the present invention.

FIG. 3 is a simplified layout of a semiconductor device according to an embodiment of the present invention, wherein reference numerals 101, 103, and 105 denote an active region defined by the device isolation structure 120, a recess gate region, and a gate region, respectively.

Referring to FIG. 3, the recess gate region 103 has an shape, wherein in a longitudinal direction of the active region 101, a width of the recess gate region 103 is less than that of the gate region 105 by a distance 2D, and in a longitudinal direction of the gate region 105, a length of the recess gate region 103 is greater than a width of the active region 101 by a distance 2E (where $0 \leq D \leq (1;3)F$, $0 \leq E \leq (1;2)F$, and distance F is the distance between the neighboring gate regions 105). In one embodiment of the present invention, a shape of the recess gate region 103 includes a closed polygon such as an ellipse and a rectangle.

Figure 4:
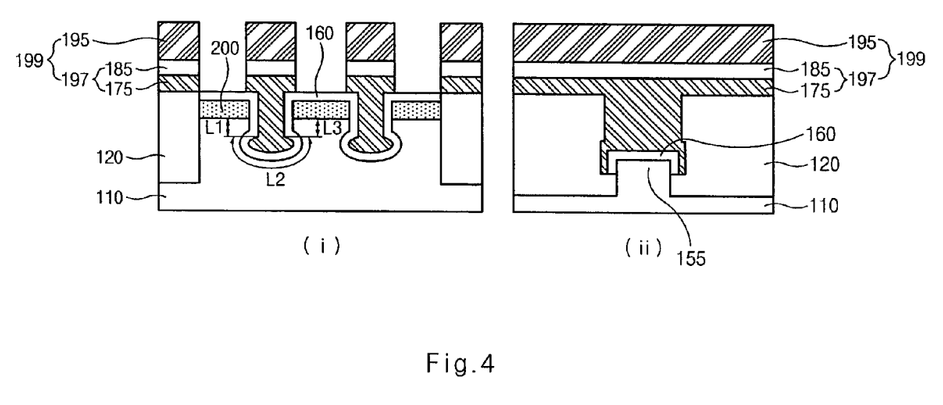
FIG. 4 is a simplified cross-sectional view illustrating a semiconductor device according to an embodiment of the present invention.

FIG. 4 is a simplified cross-sectional view of a semiconductor device according to an embodiment of the present invention, wherein FIG. 4(i) is a cross-sectional view taken along a longitudinal direction in accordance with the line I-I' of FIG. 3 and FIG. 4(ii) is a cross-sectional view taken along a latitudinal direction in accordance with the line II-II' of FIG. 3.

Referring to FIG. 4, a device isolation structure 120 defining the active region 101 shown in FIG. 3 is formed in a semiconductor substrate 110. A recess (not shown) for a recess channel region is formed in the semiconductor substrate 110 by using a mask defining the recess gate region 103 shown in FIG. 3. Here, the recess includes a Fin channel region 155 at the bottom of the recess in a longitudinal direction of the gate region 105 shown in FIG. 3 and a recess channel region (L1+L2+L3) at the lower part of the recess in a longitudinal direction of the active region 101 shown in FIG. 3, so that a width of a lower part of the recess channel region can be equal to or greater than that of its upper part. In addition, a gate insulating film 160 is formed on the semiconductor substrate 110 including the Fin recess channel region 155. A gate 199 corresponding the gate region 105 (FIG. 3) is formed over the gate insulating film 160. Gate 199 comprises a stacked structure of a gate electrode 197 and a gate hard mask layer pattern 195. In one embodiment, gate electrode 197 includes a stacked structure of a lower gate electrode 175 and an upper gate electrode 185.

Figure 5A:
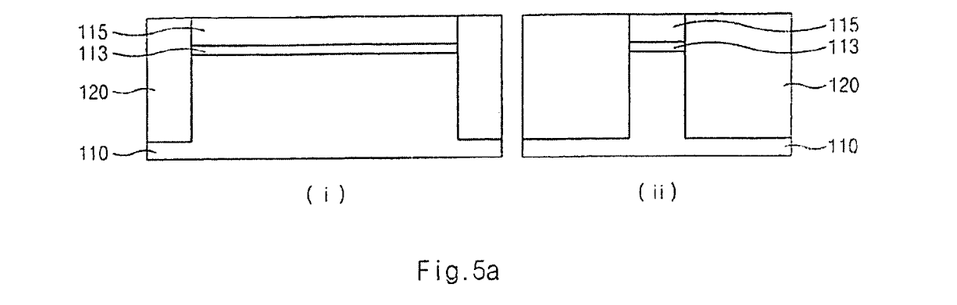
FIGS. 5a through 5h are simplified cross-sectional views illustrating a method for fabricating a semiconductor device according to an embodiment of the present invention.

FIGS. 5a through 5g are simplified cross-sectional views illustrating a method for fabricating a semiconductor device according to an embodiment of the present invention, wherein FIGS. 5a(i) through 5g(i) are cross-sectional views taken along a longitudinal direction in accordance with the line I-I' of FIG. 3 and FIGS. 5a(ii) through 5g(ii) are cross-sectional views taken along a latitudinal direction in accordance with the line II-II' of FIG. 3.

Referring to FIG. 5a, a pad oxide film 113 and a pad nitride film 115 are sequentially formed over a semiconductor substrate 110. A photoresist film (not shown) is formed on the pad nitride film 115, and exposed and developed using a device isolation mask (not shown) to form a photoresist film pattern (not shown) defining a device isolation region 120 shown in FIG. 3. The pad nitride film 115, the pad oxide film 113, and a predetermined thickness of the semiconductor substrate 110 are etched to form a trench (not shown) defining an active region 101 shown in FIG. 3. After the photoresist film pattern is then removed, an insulating film for device isolation (not shown) filling up the trench. The insulating film for device isolation is planarized until the pad nitride film 115 is exposed to form a device isolation structure 120. In one embodiment, a stacked structure of a thermal oxide film (not shown), a liner nitride film (not shown), and a liner oxide film (not shown) is formed at the interface between the trench and the insulating film for device isolation. In addition, the insulating film for device isolation includes a stacked structure of a first oxide film for device isolation (not shown) and a second oxide film for device isolation (not shown), etching rates of which are relatively different. In another embodiment, the etching rate of the first oxide film for device isolation is relatively faster than that of the second oxide film for device isolation.

Figure 5B:
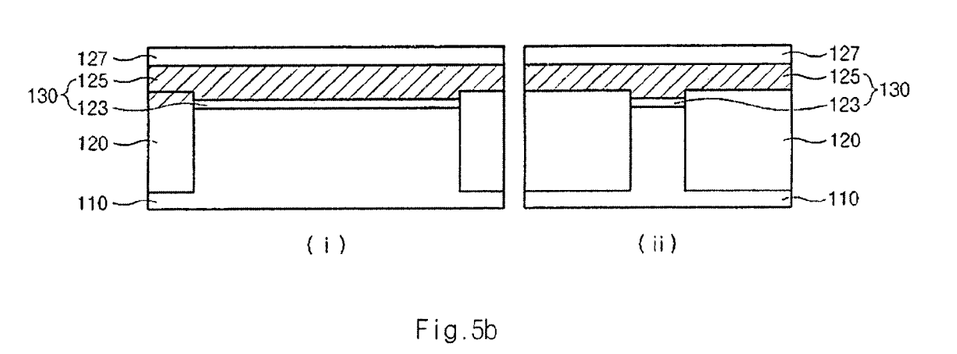

Referring to FIG. 5b, a predetermined thickness of the device isolation structure 120 is etched to lower the height of the device isolation structure 120. The pad nitride film 115 and the pad oxide film 113 are sequentially removed to expose the semiconductor substrate 110. A first oxide film 123 is formed over the exposed semiconductor substrate 110. A photoresist film (not shown) is formed over the entire surface of the resultant, and exposed and developed using a mask exposing a cell region to form a photoresist film pattern (not shown). Impurity ions are implanted on the entire surface using the photoresist film pattern as an ion implantation mask to form a well and channel ion implantation region (not shown) in the semiconductor substrate 110 under the first oxide film 123. The photoresist film pattern is then removed. A planarized nitride film 125 and a first hard mask layer 127 are sequentially formed over the entire surface of the resultant. In one embodiment, the first hard mask layer 127 is made from a polysilicon layer, an amorphous Carbon film, a nitride film, a SiON film, or combinations thereof.

Figure 5C:
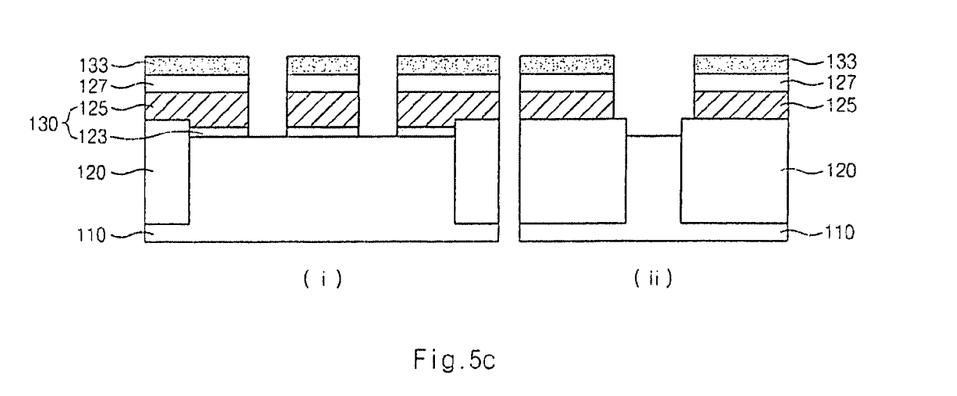

Referring to FIG. 5c, a photoresist film (not shown) is formed on the first hard mask layer 127, and then exposed and developed using a recess gate mask (not shown) to form a photoresist film pattern 133 defining the recess gate region 103 shown in FIG. 3. Here, a length of the first hard mask layer 127 exposed under the photoresist film pattern 133 in a longitudinal direction of the gate region 105 shown in FIG. 3 is greater than a width of the active region 101, and a width of the first hard mask layer 127 exposed under the photoresist film pattern 133 in a longitudinal direction of the active region 101 shown in FIG. 3 is less than a width of the gate region 105 shown in FIG. 3. Next, the exposed hard mask layer 127, the first nitride film 125, and the first oxide film 123 are etched using the photoresist film pattern 133 as an etching mask to expose the semiconductor substrate 110 and the device isolation structure 120 in the recess gate region 103 shown in FIG. 3. In one embodiment, a shape of the recess gate mask can include a closed polygon such as an ellipse and a rectangle.

In another embodiment, a first photoresist film (not shown) is formed over the first hard mask layer 127 consisting of a stacked structure of an amorphous Carbon film, a SiON film, and a polysilicon layer, and then exposed and developed using a mask defining the gate region 105 shown in FIG. 3 to form a first photoresist film pattern (not shown). The polysilicon layer of the first hard mask layer 127 is etched using the first photoresist film pattern to expose the underlying SiON film. The first photoresist film pattern is then removed. Thereafter, a second photoresist film (not shown) is formed over the entire surface of the resultant, and then exposed and developed using a mask defining the recess gate region 103 shown in FIG. 3 to form a second photoresist film pattern (not shown). The SiON film, the amorphous Carbon film, the first nitride film 125, and the first oxide film 123 are etched using the second photoresist film pattern to expose the semiconductor substrate 110 and the device isolation structure 120 in the recess gate region 103 shown in FIG. 3. The second photoresist film pattern is removed.

Figure 5D:
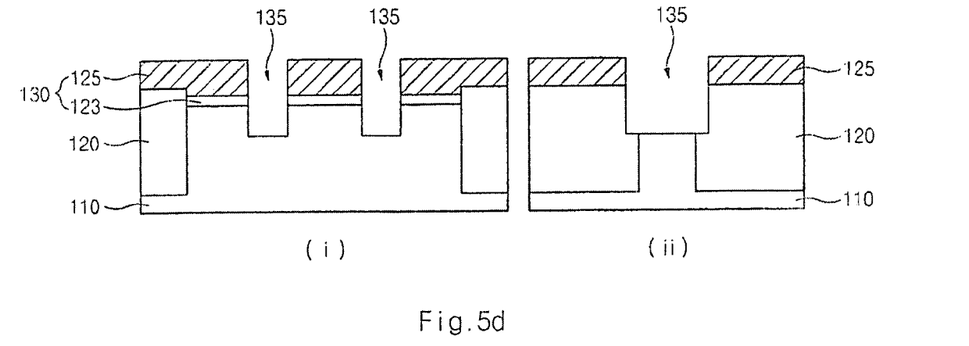

Referring to FIG. 5d, the exposed semiconductor substrate 110 and device isolation structure 120 are etched to form a first recess 135 defining a recess channel region (not shown). Here, the exposed device isolation structure 120 may be etched after a predetermined thickness of the exposed semiconductor substrate 110 is etched. The photoresist film pattern 133 and the first hard mask layer 127 are removed. In one embodiment, the removing process for the photoresist film pattern 133 and the first mask layer 127 may be simultaneously performed.

Figure 5E:
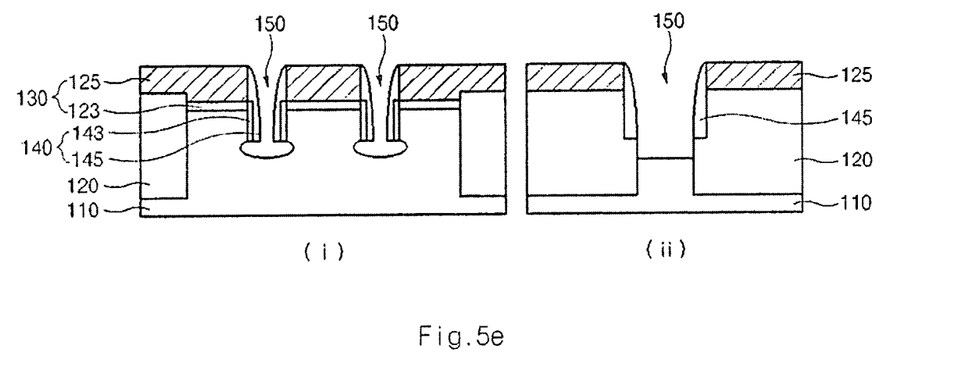

Referring to FIG. 5e, a second oxide film (not shown) is formed on the semiconductor substrate and sidewalls of the first oxide film 123, which are exposed in the first recess 135. A second nitride film (not shown) is formed over the entire surface of the resultant. The second nitride film and the second oxide film are etched using a dry etching method to form spacer 140, which includes a stacked structure of a second nitride film pattern 145 and a second oxide film pattern 143, on sidewalls of the first recess 135. The semiconductor substrate 110 exposed at the bottom of the first recess 135 is etched to form a second recess 150. In one embodiment of the present invention, the etching process for the second recess 150 is performed using an isotropic etching method, so that the width of a lower part of the second recess 150 can be equal to or greater than that of its upper part. In addition, the shape of the lower part of the second recess 155 is elliptical or circular.

Figure 5F:
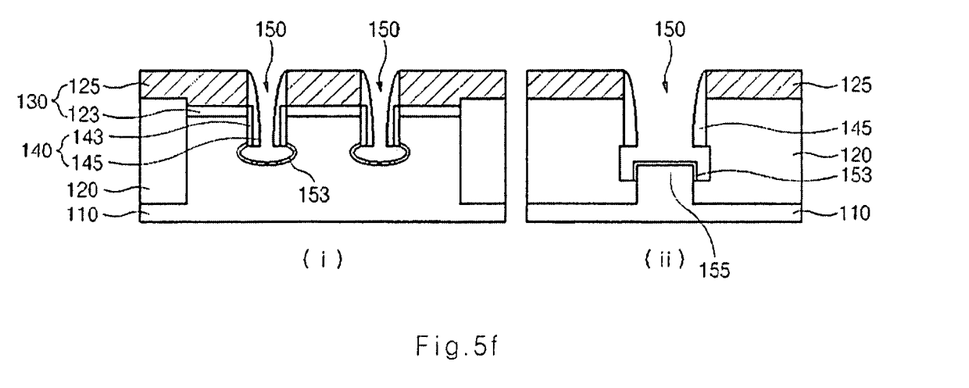

Referring to FIG. 5f, the device isolation structure 120 exposed at the lower part of the second recess 150 is etched using a wet etching method to form a Fin active region 155 at the lower part of the second recess 155. A third oxide film 153 is formed on the surface of the Fin active region 155 and the space 140. Since the upper surface of the spacer 140 is the second nitride film pattern 145, a thickness of the third oxide film 153 over the spacer 140 is less than that of the third oxide film 153 over the Fin active region 155. In one embodiment, the thickness of the third oxide film 153 over the spacer 140 ranges from 10 Å to 20 Å.

Figure 5G:
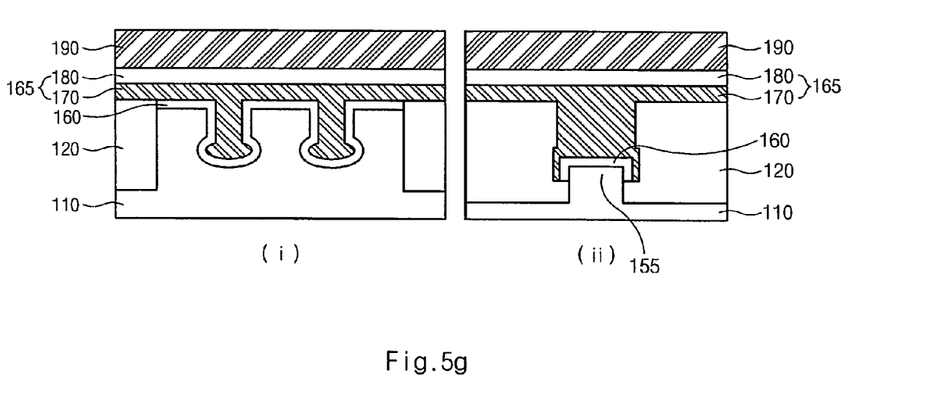

Referring to FIG. 5g, the third oxide film 153 over the spacer 140 is removed to expose the spacer 140. The second nitride film pattern 145 and the first nitride film 125 are removed to expose the second oxide film pattern 143 and the first oxide film 123. The exposed second oxide film pattern 143 and first oxide film 123 and the third oxide film 153 over the Fin active region 155 are removed using a wet etching method to expose the semiconductor substrate 110 including the Fin active region 155. A gate insulating film 160 is formed on the exposed semiconductor substrate 110 including the Fin active region 155. A planarized lower gate conductive layer 170 filling up the second recess 150 is formed on the gate insulating film 160. An upper gate conductive layer 180 and a gate hard mask layer 190 are sequentially formed on the lower gate conductive layer 170. In one embodiment, the removing process for the second oxide film pattern 143, the first oxide film 123, and the third oxide film 1S3 may be simultaneously performed.

Figure 5H:
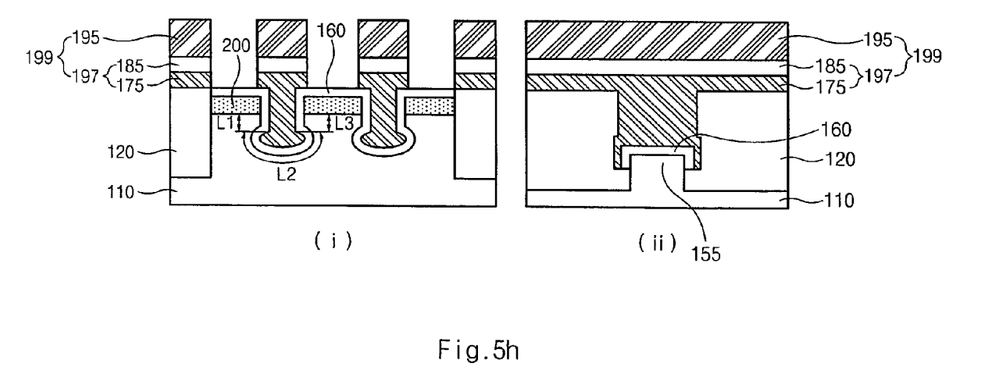

Referring to FIG. 5h, the gate hard mask layer 190, the upper gate conductive layer 180, and the lower gate conductive layer 170 are etched using a gate mask (not shown) as an etching mask to form a gate 199 corresponding to gate region 103 (FIG. 3). Here, the gate 199 includes a gate hard mask layer pattern 195 and a gate electrode 197, which is a stacked structure of an upper gate electrode 185 and a lower gate electrode 175. Ion implantation is performed using the gate 199 as an ion implantation mask to form a LDD region (not shown) in the semiconductor substrate 110 between the gates 199. In one embodiment, the lower gate conductive layer 170 is made from a polysilicon layer, a SiGe layer, or a stacked structure using a combination thereof. In another embodiment, the upper gate conductive layer 180 is made from a TiN film, a WN film, a WSi$_x$ layer, a TiSi$_x$ layer, a Ti layer, a W layer, or combinations thereof.

In addition, subsequent processes such as a process for forming a spacer on a sidewall of the gate, an ion-implantation process for forming source/drain regions in the active regions, a process for forming a landing plug, a process for forming a bit line contact and a bit line, a process for forming a capacitor, and a process for forming an interconnect may be performed.

As described above, the semiconductor substrate and method for fabricating the same in accordance with an embodiment of the present invention provides forming a recess channel region and a Fin channel region at a lower part of the recess channel region by using an island shaped recess gate mask which exposes a predetermined region of a semiconductor substrate and its neighboring device isolation structure, thereby reducing channel resistance at the lower part of the recess channel region. Accordingly, refresh characteristic of DRAM device can be improved. In addition, SCE (Short channel effect) of the device is improved because the Fin channel region is formed at the lower part of the recess channel region. The driving current of the device is increased due to an increased channel width. Accordingly, the read/write speed characteristics of the DRAM structure are improved.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device comprising:
   (a) forming a device isolation structure in a semiconductor substrate to define an active region having a pad insulating film;
   (b) etching the pad insulating film to expose the semiconductor substrate;
   (c) etching a predetermined thickness of the exposed semiconductor substrate using an island shaped recess gate mask to form a first recess and a second recess, wherein a Fin channel region is formed at a lower part of the second recess, the etching of the predetermined thickness comprising:
- (c-1) forming a first insulating film over the exposed semiconductor substrate and a first hard mask layer over the first insulating film and the device isolation structure;
- (c-2) etching a predetermined region of the first hard mask layer, the first insulating film, the semiconductor substrate and the device isolation structure using the island shaped recess gate mask to form the first recess defining a recess channel region;
- (c-3) removing the first hard mask layer;
- (c-4) forming a spacer on a sidewall of the first recess;
- (c-5) isotropically etching the semiconductor substrate exposed at the lower part of the first recess to form the second recess;
- (c-6) isotropically etching the device isolation structure exposed at the lower part of the second recess in a longitudinal direction of the gate region to form a Fin channel region; and
- (c-7) removing the spacer and the first insulating film to expose the semiconductor substrate;
(d) forming a gate insulating film over the active region including the Fin channel region, the first recess, and the second recess;
(e) forming a gate conductive layer filling up the Fin channel region, the first recess, and the second recess;
(f) forming a gate hard mask layer over the gate conductive layer; and
(g) patterning the gate hard mask layer and the gate conductive layer using a gate mask as an etching mask to form a gate structure.

2. The method according to claim 1, wherein step (a) includes:
- (a-1) etching the semiconductor substrate having the pad insulating film using a device isolation mask as an etching mask to form a trench; and
- (a-2) forming a device isolation structure defining the active region, wherein the device isolation structure fills the trench.

3. The method according to claim 2, further comprising forming a stacked structure of a thermal oxide film, a liner nitride film, and a liner oxide film at an interface between the trench and the device isolation structure.

4. The method according to claim 2, wherein the device isolation structure includes a stacked structure of a first oxide film for device isolation and a second oxide film for device isolation, etching rates of which are relatively different.

5. The method according to claim 1, wherein the island shaped recess gate mask includes a closed polygon.

6. The method according to claim 5, wherein the closed polygon recess gate mask is elliptical or rectangular.

7. The method according to claim 6, wherein in a longitudinal direction of the active region, a width of the recess gate mask is less than a width of the gate electrode by a distance 2D, and in a longitudinal direction of the gate electrode, a length of the recess gate mask is greater than a width of the active region by a distance 2E (where $0<D<(1/3)F$, $0<E<(1/2)F$, and a distance F is the distance between neighboring gate regions).

8. The method according to claim 1, wherein the first insulating film includes a stacked structure of a first oxide film and a second oxide film.

9. The method according to claim 1, wherein the first hard mask layer is selected from the group consisting of a nitride film, a polysilicon film, a amorphous Carbon film, a SiON film, and combinations thereof.

10. The method according to claim 1, further comprising: forming a photoresist film pattern exposing a recess gate region over the first hard mask layer; etching a predetermined region of the first hard mask layer, the first insulating film, the semiconductor substrate, and the device isolation structure using the photoresist film pattern as an etching mask to form the first recess defining the recess channel region; and removing the photoresist film pattern.

11. The method according to claim 1, further comprising: forming a first photoresist film pattern defining the gate region over the first hard mask layer; etching a predetermined thickness of the first hard mask layer using the first photoresist film pattern as an etching mask; removing the first photoresist film pattern; forming a second photoresist film pattern defining the recess gate region over the remaining first hard mask layer; etching the remaining first hard mask layer, the first insulating film, the semiconductor substrate, and the device isolation structure using the second photoresist film pattern as an etching mask to form a first recess defining a recess channel region; and removing the second photoresist film pattern.

12. The method according to claim 1, further comprising: forming a second insulating film at a surface of the first recess; and etching the second insulating film by a dry etching method to form the spacer on a sidewall of the recess.

13. The method according to claim 12, wherein the second insulating film is selected from the group consisting of an oxide film, a nitride film, and combination thereof 14. The method according to claim 1, wherein in a longitudinal direction of the active region, a shape of a lower part of the second recess is elliptical or circular.

15. The method according to claim 1, wherein the removing process for the spacer and the first insulating film is performed by a wet etching method.

* * * * *